United States Patent [19]

Pritchard et al.

[11] Patent Number: 4,946,804
[45] Date of Patent: Aug. 7, 1990

[54] APERTURE FORMING METHOD

[75] Inventors: Alan P. Pritchard; Stephen P. Lake, both of Bristol, United Kingdom

[73] Assignee: British Aerospace Public Limited Company, London, England

[21] Appl. No.: 175,215

[22] Filed: Mar. 30, 1988

[30] Foreign Application Priority Data

Jun. 30, 1987 [GB] United Kingdom ............... 8715283

[51] Int. Cl.⁵ .................. H01L 21/465; H01L 21/47; H01L 21/312
[52] U.S. Cl. .................... 437/228; 437/229; 437/245; 437/194; 156/659.1
[58] Field of Search ............ 156/659.1, 643, 644, 156/646, 651, 652, 665, 653; 437/228, 203, 194, 245, 246, 187, 197, 229

[56] References Cited

U.S. PATENT DOCUMENTS

| | | | |
|---|---|---|---|
| 4,174,562 | 11/1979 | Sanders et al. | 437/194 |
| 4,253,888 | 3/1981 | Kikuchi | 437/24 |
| 4,305,974 | 12/1981 | Abe et al. | 437/194 |
| 4,335,506 | 6/1982 | Chiu et al. | 156/665 |
| 4,381,595 | 5/1983 | Denda et al. | 437/194 |
| 4,592,800 | 6/1986 | Landau et al. | 156/665 |
| 4,631,806 | 12/1986 | Poppert et al. | 437/194 |
| 4,718,977 | 1/1988 | Contiero et al. | 156/665 |

FOREIGN PATENT DOCUMENTS 63-4360  1/1988  Japan .................... 156/665

Primary Examiner—Brian E. Hearn
Assistant Examiner—M. Wilczewski
Attorney, Agent, or Firm—Cushman, Darby & Cushman

[57] ABSTRACT

A method of forming through-holes in a multi-level interconnect system in which a layer of photo-resist is spun over a masking layer prior to mask-etching so that when the photo-resist is exposed and developed some remains in the bottom of through holes formed in the surface layer so as to protect the base layer from the mask-etching agent.

7 Claims, 1 Drawing Sheet

APERTURE FORMING METHOD

BACKGROUND OF THE INVENTION

1. Field of the Invention

The present invention relates to a method of forming apertures in a surface layer of a layered device and relates particularly to the formation of integrated circuits.

2. Description of the Related Art

In known methods of fabricating integrated circuits involving multi-level interconnect systems a dielectric layer eg. polyimide is deposited on a metal layer, eg. aluminium, forming the normal top layer of an integrated circuit wafer. Through holes are formed to enable interlevel connections and metal is deposited in an appropriate configuration so as to make the desired connections. The preceding steps are then repeated as required to build up a multi-level structure.

It is known to etch the through holes in the polyimide layer using oxygen plasma utilising an aluminium mask. However, a problem arises in that, after formation of the through holes when the mask is removed, the agent used to remove the aluminium mask also attacks the aluminium base layer exposed at the bottom of the through holes.

SUMMARY OF THE INVENTION

According to the present invention we provide a method of forming apertures in a surface layer of a layered device comprising:
  applying to the surface layer a masking layer defining the position of the apertures;
  etching so as to remove the surface layer material at said positions;
  applying a layer of protective material over the masking layer so that the protective material accumulates at a greater depth in the apertures than at the top of the surface layer;
  removing the bulk of the protective material, and etching to remove the masking layer.

Preferably, the protective material is photo-resist and the bulk of it is removed by exposure and development.

In this method, the photo-resist accumulates to a greater depth in the holes than on the surface of the mask so that some photo-resist remains in the through holes after development and protects the underlying layer during the mask-etch process. This protective layer of photo-resist is afterwards removed. Thus the invention utilises the depth of the through holes to protect the underlying layer to the best possible degree.

Preferably, prior to applying the protective material a light mask etch is performed so as to erode the edges of the masking layer around the apertures.

This step is preferred in cases where the etching causes erosion of the side walls of the through holes thereby leaving overhanging mask edges which may prevent the protective material dropping fully into the through holes. The light etch is tailored so as to cause minimal damage to the underlying layer.

BRIEF DESCRIPTION OF THE DRAWINGS

A specific embodiment of the present invention will now be described, by way of example, with reference to the accompanying drawings in which.

DETAILED DESCRIPTION OF THE PRESENTLY PREFERRED EXEMPLARY EMBODIMENT

Figure 1:
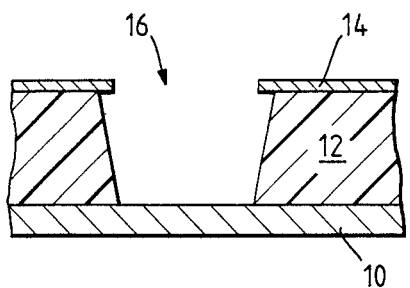
FIGS. 1 to 4 are diagrams illustrating part of an integrated circuit device during successive stages of a method according to the present invention.

In FIG. 1, an integrated circuit device comprises an aluminium base layer 10, a polyimide insulating layer 12 and an aluminium mask 14 defining a through hole 16. The hole 16 has been formed to allow electrical connections to be made between the aluminium base layer 10 and a further metal layer to be deposited on the polyimide layer 12 at a later stage.

Figure 2:
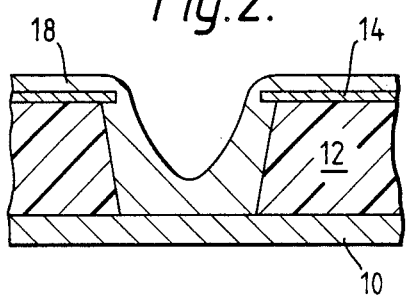
Figure 3:
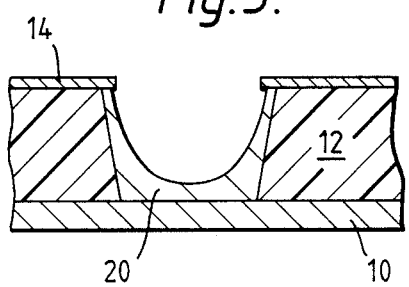
Figure 4:
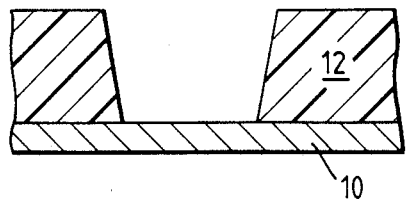

Referring to FIG. 2, a layer of photo-resist 18 has been spun onto the mask 14 and it is clear that the photo-resist 18 collects in the hole 16 to a greater depth than on the surface of the mask 14. Therefore, when the photo-resist 18 is exposed and developed, a layer 20 of photo-resist is left in the bottom of the hole 16 (FIG. 3) which protects the part of the base 10 at the bottom of the hole 16 during etching of the mask 14. The mask 14 is subsequently etched and the photo-resist removed to produce the stage shown at FIG. 4.

In this way a method according to the present invention utilises the depth of the through hole 16 to advantage to protect the aluminium layer 10 from the mask etching agent.

It should be understood that the present invention is applicable in any process in which apertures are formed in a surface layer of a layered device and in which the underlying layer is otherwise liable to damaged during removal of a masking layer.

We claim:

1. A method of forming apertures in a surface layer of a layered device comprising:
  applying to the surface layer a masking layer having apertures therein defining the position of apertures to be formed in the surface layer;
  etching so as to remove the surface layer material at said positions;
  applying a layer of protective material over the masking layer so that the protective material accumulates at a greater thickness in the apertures than at the top of the surface layer;
  removing at least the protective material other than that accumulated in the apertures, and
  etching to remove the masking layer.

2. A method according to claim 1 wherein the protective material is photo-resist and the bulk of it is removed by exposure and development.

3. A method according to claim 1 comprising: prior to applying the protective material, performing a light mask etch so as to erode edges of the masking layer around the apertures.

4. A method according to claim 1 wherein the masking layer and a layer underlying the surface layer are both formed from the same material.

5. A method according to claim 4 wherein said same material is aluminium.

6. A method according to claim 1 wherein said surface layer is an electrically insulating material.

7. A method according to claim 6 wherein the surface layer is formed from polyimide.

* * * * *